(12) United States Patent
Basho et al.

(10) Patent No.: US 9,332,655 B2
(45) Date of Patent: May 3, 2016

(54) ELECTRONIC CIRCUIT, LIGHT SOURCE DEVICE, AND METHOD OF MANUFACTURING ELECTRONIC CIRCUIT

(71) Applicants: Hiroyuki Basho, Kanagawa (JP); Katsuhiko Maeda, Kanagawa (JP); Masashi Suzuki, Saitama (JP); Yuugo Matsuura, Kanagawa (JP)

(72) Inventors: Hiroyuki Basho, Kanagawa (JP); Katsuhiko Maeda, Kanagawa (JP); Masashi Suzuki, Saitama (JP); Yuugo Matsuura, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 195 days.

(21) Appl. No.: 14/138,673

(22) Filed: Dec. 23, 2013

(65) Prior Publication Data
US 2014/0198469 A1    Jul. 17, 2014

(30) Foreign Application Priority Data
Jan. 16, 2013  (JP) .................................. 2013-005136

(51) Int. Cl.
| H01R 9/00 | (2006.01) |
| H05K 3/34 | (2006.01) |
| H05K 3/30 | (2006.01) |
| B41J 2/47 | (2006.01) |

(52) U.S. Cl.
CPC .............. *H05K 3/3447* (2013.01); *B41J 2/473* (2013.01); *H05K 3/308* (2013.01); *H05K 2201/09072* (2013.01); *H05K 2201/09645* (2013.01); *H05K 2201/09854* (2013.01); *H05K 2201/10106* (2013.01); *H05K 2201/10121* (2013.01); *H05K 2201/10757* (2013.01); *H05K 2203/0195* (2013.01); *Y10T 29/49142* (2015.01)

(58) Field of Classification Search
CPC .......... B41J 2/473; H05K 2201/09072; H05K 2201/09645; H05K 2201/09854; H05K 2201/10106; H05K 2201/10121; H05K 2201/10757; H05K 2203/0195; H05K 3/308; H05K 3/3447; Y10T 29/49142
USPC .......................... 361/760, 772, 773, 774, 806
See application file for complete search history.

(56) References Cited

U.S. PATENT DOCUMENTS

| 2007/0097201 | A1  | 5/2007  | Kanzaki et al. | |
| 2009/0201695 | A1* | 8/2009  | Lee ........................... | F21K 9/00 362/549 |
| 2010/0328918 | A1* | 12/2010 | Yang ...................... | H05K 3/301 361/783 |
| 2014/0085841 | A1* | 3/2014  | Fukumoto ............ | H05K 1/0203 361/760 |

FOREIGN PATENT DOCUMENTS

| JP | 2-023540   | 1/1990 |
| JP | 7-154046   | 6/1995 |
| JP | 10-107378  | 4/1998 |
| JP | 2006-072136 | 3/2006 |

* cited by examiner

*Primary Examiner* — Yuriy Semenenko
(74) *Attorney, Agent, or Firm* — Oblon, McClelland, Maier & Neustadt, L.L.P

(57) ABSTRACT

An electronic circuit having an electronic component mounted on a substrate, a light source device having the electronic circuit, and a method of manufacturing the electronic circuit on which the electronic component is mounted on the substrate are described. The electronic component has a plurality of lead pins to be electrically connected to wirings on the substrate. The substrate is formed with a hole having a larger dimension than a maximum distance between at least two lead pins of the lead pins. The lead pins are inserted into the hole from sides of tips of the lead pins while being bent at a plurality of bending portions, and fixed to the substrate by a solder.

13 Claims, 11 Drawing Sheets

ELECTRONIC CIRCUIT, LIGHT SOURCE DEVICE, AND METHOD OF MANUFACTURING ELECTRONIC CIRCUIT

CROSS-REFERENCE TO RELATED APPLICATIONS

This patent application is based on and claims priority pursuant to 35 U.S.C. §119 to Japanese Patent Application No. 2013-005136, filed on Jan. 16, 2013, in the Japan Patent Office, the entire disclosure of which is hereby incorporated by reference herein.

BACKGROUND

1. Technical Field

The present invention relates to an electronic circuit having an electronic component mounted on a substrate, a light source device having the electronic circuit, and a method of manufacturing the electronic circuit on which the electronic component is mounted on the substrate.

2. Description of the Related Art

In general, an electronic component includes a lead pin as a connecting terminal. In the case in which an electronic circuit is fabricated by using the electronic component in plural, the electronic components are mounted on a substrate.

As a method of mounting an electronic component on a substrate, for example, there is known through-hole mounting. Referring to the through-hole mounting, lead pins of an electronic component are inserted into a through hole provided corresponding to the positions and number of the lead pins in a mounting position on the substrate and are fixed by soldering or the like.

In recent years, the need for mounting electronic components on an electronic circuit at a high density is increasing. For example, in some laser diodes (hereinafter referred to as "LDs (Laser Diodes)" according to an example of the electronic component, a plurality of light emitting elements are disposed in a single component and irradiation can be thus carried out with a plurality of beams, that is, so-called multibeams. In a laser diode array (hereinafter referred to as an "LDA (Laser Diode Array)") capable of carrying out the irradiation with the multibeam, lead pins corresponding to the light emitting elements are arranged circumferentially at a small interval.

In the case in which the LDA is through-hole mounted on a substrate, it is necessary to form a plurality of through holes on the substrate at a small interval. In the case in which the LDA is through-hole mounted on the substrate, moreover, it is necessary to insert the lead pins in through holes, thereby soldering them.

In order to insert the lead pins in the through holes provided at the small interval, it is conceivable to increase diameters of the through holes for easy insertion of the lead pins.

In order to easily insert the lead pin into the substrate, generally, it is desirable to form a through hole having a size which is at least four times as large as a lead pin diameter.

In this case, however, it is necessary to increase the number of the lead pins and to reduce a pitch. When through holes each having an enough size with respect to the lead pin diameter are to be formed on the substrate, adjacent through holes are thinned and caused to be broken, so that the through holes cannot be formed.

In the case in which the lead pins are inserted into the through holes provided at the small interval, moreover, it is conceivable to change shapes of the lead pins (forming), thereby increasing a pitch between the lead pins. By carrying out the forming over the lead pins, it is possible to easily carry out attachment by increasing the interval among the through holes on the substrate.

Also in this case, however, the lead pin diameter of the LDA is 0.3 mm, for example, which is smaller than a lead pin diameter, 0.45 mm for example, of an LD in the related art. In other words, the lead pin of the LDA tends to be deformed by external force. In the case in which the LDA is mounted on the substrate, accordingly, even if the lead pin has been subjected to the forming, it is hard to maintain a state at the forming while guiding the lead pin to the substrate.

In the case in which the LDAs are mounted in the same substrate, moreover, it is impossible to ensure an enough pitch between the lead pins for obtaining an advantage in the attachment even if the forming is performed because the attachment intervals among the LDAs are close to each other due to optical limitations.

In order to mount the LDAs at a small interval in the same substrate to increase printing speed and definition, furthermore, it is necessary to cause a beam interval in a sub-scanning direction to be uniform, that is, to perform so-called pitch adjustment between sub-scanning beams before assembling the LDAs onto the substrate.

In place of the method of manufacturing an electronic circuit by forming a through hole and mounting an electronic component, therefore, there is known a method of manufacturing an electronic circuit by providing a single large hole on a substrate with respect to a single electronic component and soldering a lead pin of the electronic component to the substrate, for example, as described in Patent Document 1 (Japanese Patent Application Registration No. JP-2638953-B1, that is, JP-H02-23540-A), Patent Document 2 (Japanese Patent Application Publication No. JP-H07-154046-A), and Patent Document 3 (Japanese Patent Application Publication No. JP-2006-072136-A).

FIG. 1 is a sectional side view showing an electronic circuit 100 according to the related art. As shown in FIG. 1, in the case in which the electronic circuit 100 is manufactured by using the technique of Patent Document 1, a hole 11 is formed on a substrate 10. The hole 11 has a larger diameter than a diameter of a circumference (hereinafter referred to as a "lead pin circle diameter") of a position in which lead pins 21 of an LDA 20 are disposed.

Referring to the technique of the Patent Document 1, the lead pins 21 are caused to pass through the hole 11 and are fixed by a solder 30 at an opposite surface (hereinafter referred to as a "back face") to a surface of the substrate 10 on which the LDA 20 is mounted.

Referring to the techniques of Patent Document 2 and Patent Document 3, moreover, the lead pin 21 is bent along the back face of the substrate 10 and is thus fixed by a solder 30a.

Referring to the technique of the Patent Document 1 shown in FIG. 1, however, wraparound of the solder 30 toward the hole 11 side with respect to the lead pin 21 is insufficient and a solder fillet is formed insufficiently as compared with a method of soldering the lead pin passing through the through hole. For this reason, the technique of the Patent Document 1 lacks reliability of the fixing state of the LDA 20.

FIG. 2 is another sectional side view showing the electronic circuit according to the related art. In the case in which the lead pin 21 is bent along the back face of the substrate 10 and is thus fixed by the solder 30a as in the Patent Document 2 and the Patent Document 3, there is generated a so-called solder bridge in which the adjacent solders 30a come in contact with each other as shown in FIG. 2 if a distance C between the leads representing an interval between adjacent LDAs 20 is reduced. In the techniques of the Patent Document 2 and the Patent Document 3, therefore, it is impossible to mount the LDA 20 at a small interval.

SUMMARY

According to one aspect, an electronic circuit has an electronic component mounted on a substrate. The electronic component has a plurality of lead pins to be electrically connected to wirings on the substrate. The substrate is formed with a hole having a larger dimension than a maximum distance between at least two pints of the lead pins. The lead pins are inserted into the hole from sides of tips of the lead pins while being bent by a plurality of bending portions, and fixed to the substrate by a solder.

DETAILED DESCRIPTION OF THE INVENTION

An electronic circuit, a light source device having the electronic circuit and a method of manufacturing the electronic circuit according to example embodiments of the present invention will be described below with reference to the drawings.

Electronic Circuit (1)

First of all, an embodiment of the electronic circuit according to the present invention will be described.

Figure 3:
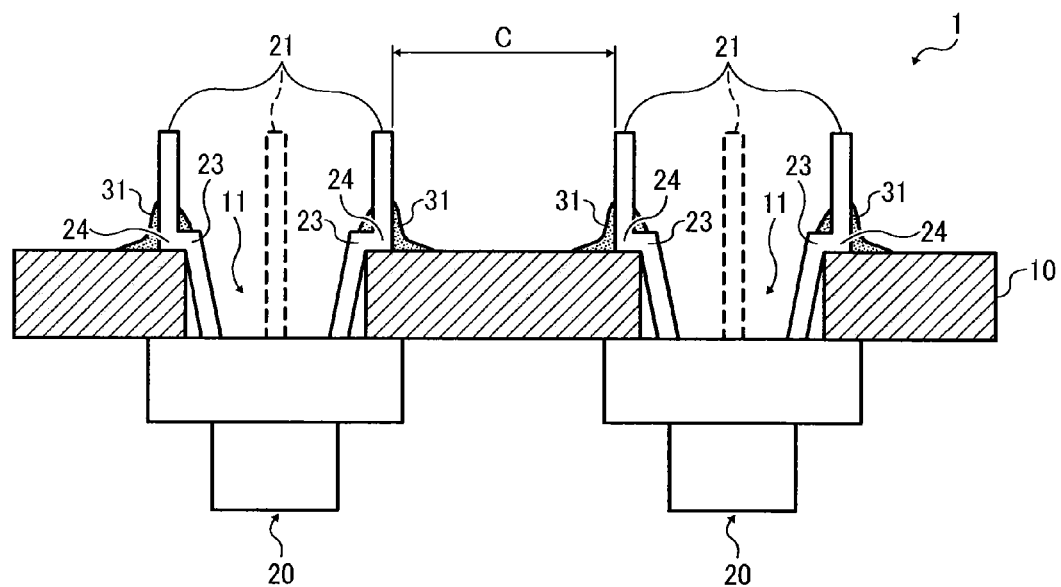
FIG. 3 is a sectional side view showing an electronic circuit according to an embodiment of the present invention.
Figure 4:
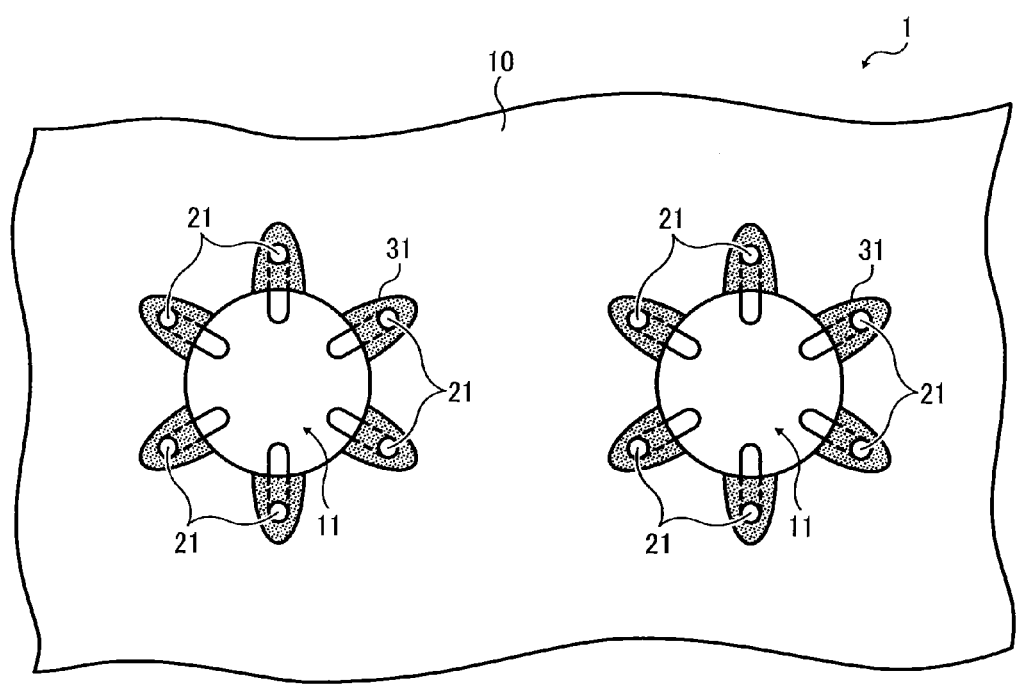
FIG. 4 is a rear view showing the electronic circuit of FIG. 3.

FIG. 3 is a sectional side view showing an embodiment of an electronic circuit 1 according to the present invention. FIG. 4 is a rear view showing the embodiment of the electronic circuit 1.

The electronic circuit 1 includes a substrate 10 and an LDA 20 having a plurality of lead pins 21. As an example in which a plurality of electronic components are mounted on the electronic circuit 1, two LDAs 20 are mounted.

A hole 11 is formed on the substrate 10. The hole 11 has a larger dimension than a lead pin circle diameter of the lead pins 21 (a larger dimension than a maximum distance between the lead pins). The hole 11 is provided corresponding to the number of the LDAs 20 to be mounted.

A back face of the substrate 10 is provided with a circuit pattern as wirings to be electrically connected to the lead pins 21. Moreover, the LDA 20 of the substrate 10 is mounted on an opposite surface to the back face of the substrate 10 (which will be hereinafter referred to as a "front face").

Figure 5A:
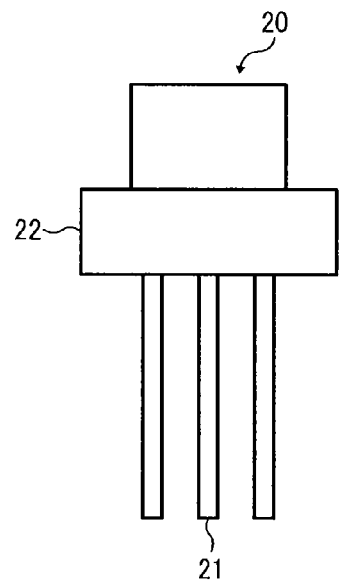
FIGS. 5A and 5B are side and rear views showing an electronic component to be mounted on the electronic circuit of FIG. 3, respectively.
Figure 5B:
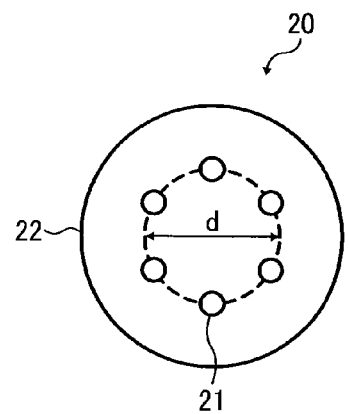

FIGS. 5A and 5B are side and rear views showing the LDA 20 to be mounted on the electronic circuit 1, respectively.

The electronic component according to the present invention is not restricted to the LDA but may be any electronic component having a plurality of lead pins, for example, a light emitting diode, various capacitors or resistors, or the like.

The LDA 20 has the lead pins 21 provided on a package 22. A surface of the package 22 on which the lead pins 21 are provided is opposed to the front face of the substrate 10 in a mounted state. Moreover, the lead pins 21 are disposed on a lead pin circle having a lead pin circle diameter d (on the same circumference).

As shown in FIGS. 3 and 4, in the LDA 20, the lead pins 21 pass through the hole 11 in a direction from the front face to the back face in the substrate 10 and are fixed to the substrate 10 by using a solder 31. The lead pins 21 each have a plurality of bending portions, that is, a first bending portion 23 and a second bending portion 24 which are bent in a direction toward a peripheral wall of the hole 11 in the vicinity of the back face of the substrate 10 as seen in a direction toward a sectional side surface. The lead pin 21 is soldered by a solder 31 in a portion between the first bending portion 23 and the second bending portion 24.

As described above, a portion from the first bending portion 23 to the second bending portion 24 is bent in the direction toward the peripheral wall of the hole 11 (a transverse direction in FIG. 3) and a portion from the second bending portion 24 to a tip is bent in a perpendicular direction to the substrate 10 (an extending direction of the lead pin 21: a vertical direction in FIG. 3). In other words, the lead pin 21 is bent in different directions at the first bending portion 23 and at the second bending portion 24.

Bending directions of the first bending portions 23 located at the greatest distance from the tips of the lead pins 21 among the plurality of bending portions are equivalent to directions in which the lead pins 21 separate from each other. In other words, the bending directions of the lead pins 21 at the first bending portions 23 are equivalent to directions in which the lead pins approach the substrate 10.

Bending directions of the second bending portions 24 located closest to the tips of the lead pins 21 among the plurality of bending portions are equivalent to directions in which the lead pins 21 approach each other. In other words, the bending directions of the lead pins 21 at the second bending portions 24 are equivalent to directions in which the lead pins separate from the substrate 10.

The lead pin 21 comes in contact with a land (not shown) to be a terminal of the circuit pattern provided on the back face of the substrate 10, in a portion between the first bending portion 23 and the second bending portion 24.

The first bending portion 23 and the second bending portion 24 are formed as described above. In the electronic circuit 1, consequently, a solder fillet is formed by the solder 31 in a manner as to surround the lead pin 21 on the back face of the substrate 10.

Figure 1:
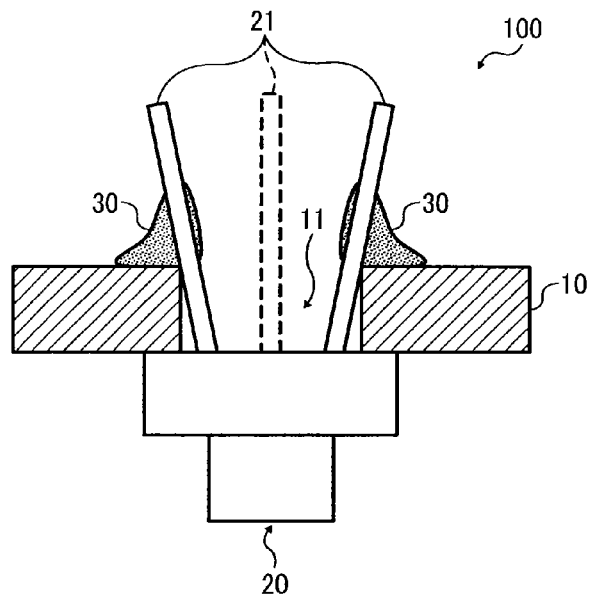
FIG. 1 is a sectional side view showing an electronic circuit according to a related art.
Figure 2:
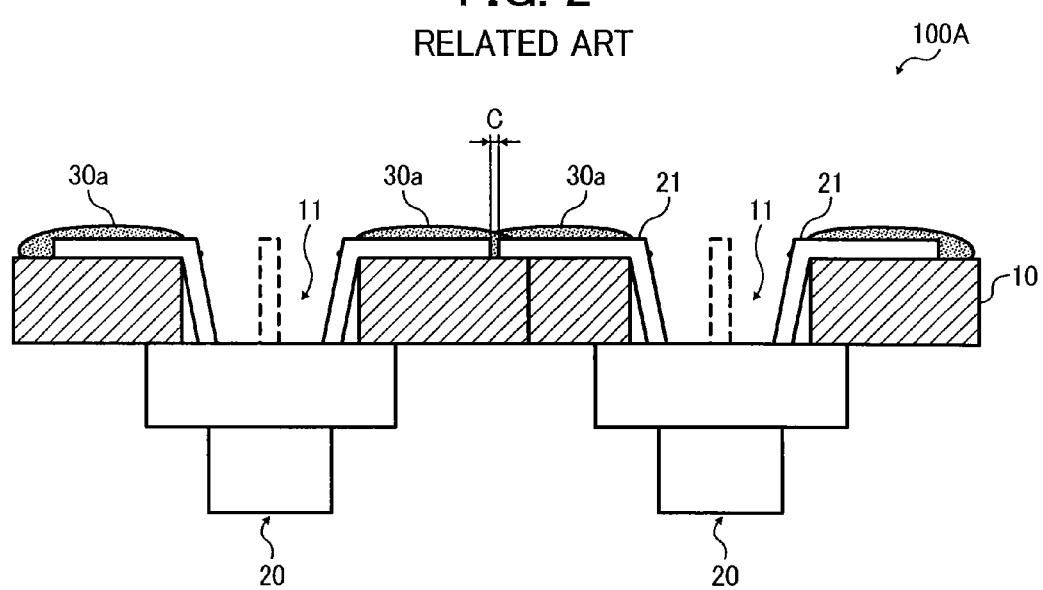
FIG. 2 is a sectional side view showing an electronic circuit according to a related art.

By the formation of the first bending portion 23 and the second bending portion 24 as described above, moreover, a distance C between the lead pins 21 of adjacent LDAs 20 can be larger in the electronic circuit 1 than that in the electronic circuits according to the related art shown in FIGS. 1 and 2.

According to the electronic circuit 1, therefore, it is possible to mount the LDA 20 having the lead pins 21 on the substrate 10 by a simple process with high soldering reliability obtained.

Electronic Circuit (2)

Next, as to another embodiment of the electronic circuit according to the present invention, differences from the embodiment described above will be mainly described.

Figure 6:
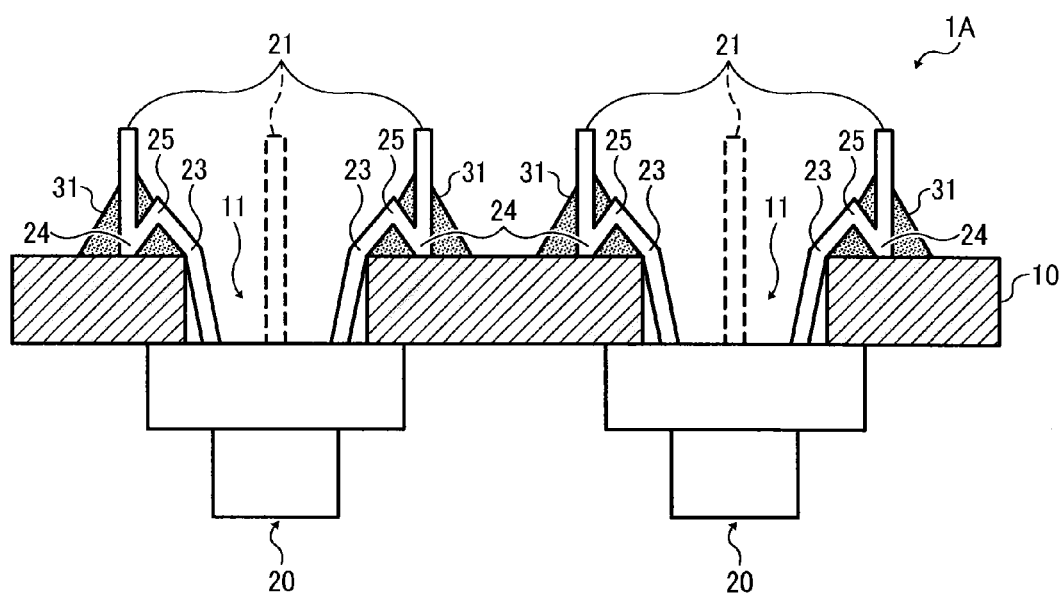
FIG. 6 is a sectional side view showing an electronic circuit according to an embodiment of the present invention.

FIG. 6 is a sectional side view showing an example of the electronic circuit according to the present embodiment.

An electronic circuit 1A shown in FIG. 6 is different from the electronic circuit 1 according to the embodiment described above in that it has a third bending portion 25 in addition to a first bending portion 23 and a second bending portion 24 as bending portions.

A lead pin 21 is bent in such a direction as to approach a substrate 10 at the first bending portion 23, and then, is bent in such a direction as to further approach the substrate 10 (a direction toward a back face of the substrate 10) at the third bending portion 25. A bending direction of the second bending portion 24 is equivalent to a separating direction from the substrate 10 in the same manner as in the electronic circuit 1 according to the embodiment described above.

The lead pin 21 comes in contact with a land (not shown) to be a terminal of the circuit pattern provided on the back face of the substrate 10, in a portion between the first bending portion 23 and the second bending portion 24.

The first bending portion 23, the second bending portion 24 and the third bending portion 25 are formed as described above. In the electronic circuit 1A, consequently, a solder fillet is formed by a solder 31 in a manner as to surround the lead pin 21 on the back face of the substrate 10.

By the formation of the first bending portion 23, the second bending portion 24 and the third bending portion 25 as described above, moreover, a distance C between the lead pins 21 of adjacent LDAs 20 can be larger in the electronic circuit 1A than that in the electronic circuits according to the related art shown in FIGS. 1 and 2.

According to the electronic circuit 1A, therefore, it is possible to mount the LDA 20 having the lead pins 21 on the substrate 10 by a simple process with high soldering reliability obtained.

Electronic Circuit (3)

Next, as to another embodiment of the electronic circuit according to the present invention, differences from the embodiments described above will be mainly described.

Figure 7:
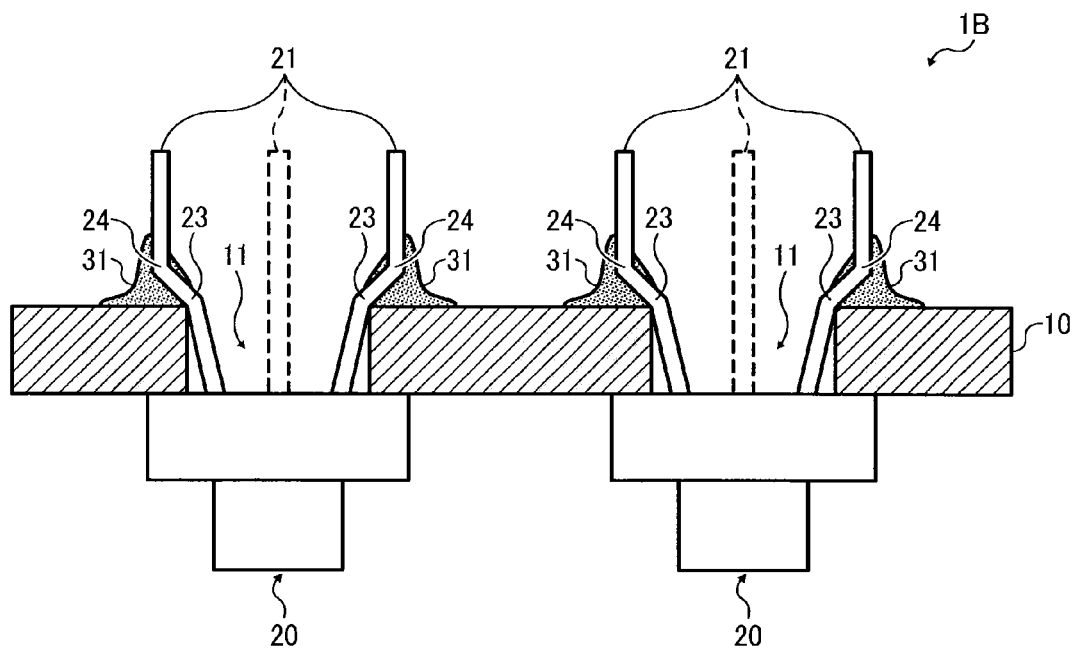
FIG. 7 is a sectional side view showing an electronic circuit according to an embodiment of the present invention.

FIG. 7 is a sectional side view showing an example of the electronic circuit according to the present embodiment.

Bending degrees of a first bending portion 23 and a second bending portion 24 in an electronic circuit 1B shown in FIG. 7 are different from those in the electronic circuit 1 according to the embodiments described above.

A part of a lead pin 21 between the first bending portion 23 and the second bending portion 24 is not bent in a direction along a substrate 10 but is bent in such a direction as to separate from the substrate 10 at a predetermined angle. In other words, the part between the first bending portion 23 and the second bending portion 24 does not come in contact with a back face of the substrate 10.

The lead pin 21 comes in contact with a land (not shown) to be a terminal of a circuit pattern provided on the back face of the substrate 10 in a place in the vicinity of the first bending portion 23 between the first bending portion 23 and the second bending portion 24.

The first bending portion 23 and the second bending portion 24 are formed as described above. In the electronic circuit 1B, consequently, a solder fillet is formed by a solder 31 in a manner as to surround the lead pin 21 on the back face of the substrate 10.

By the formation of the first bending portion 23 and the second bending portion 24 as described above, moreover, a distance C between the lead pins 21 of adjacent LDAs 20 can be larger in the electronic circuit 1B than that in the electronic circuits according to the related art shown in FIGS. 1 and 2.

According to the electronic circuit 1B, therefore, it is possible to mount an LDA 20 having the lead pins 21 on the substrate 10 by a simple process with high soldering reliability obtained.

Electronic Circuit (4)

Next, as to another embodiment of the electronic circuit according to the present invention, differences from the embodiments described above will be mainly described.

Figure 8:
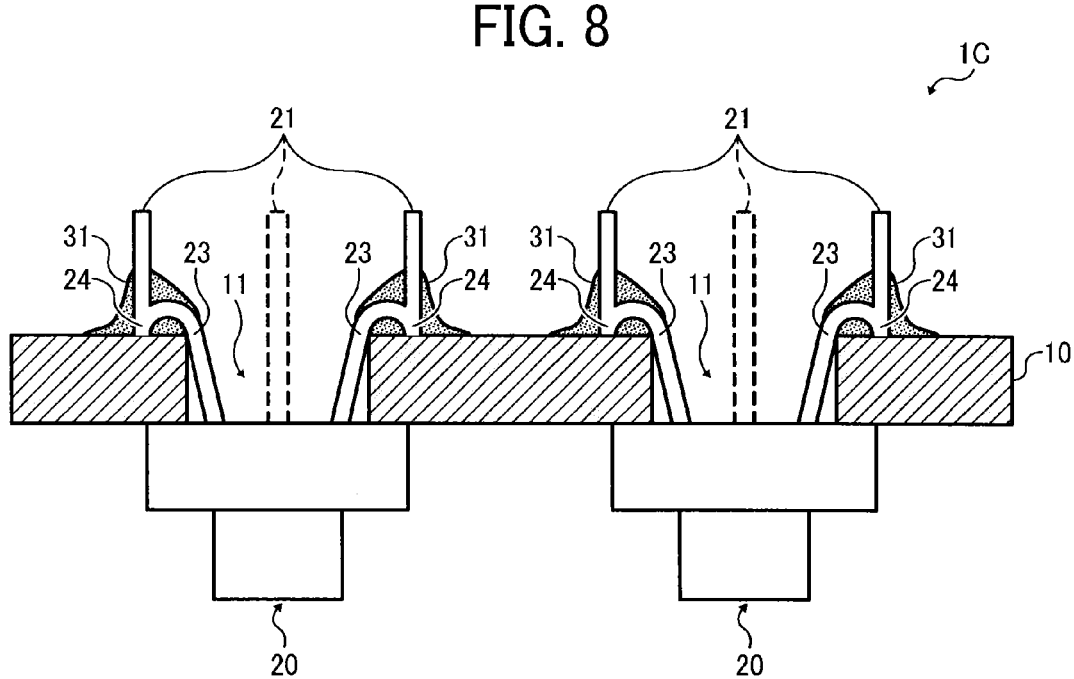
FIG. 8 is a sectional side view showing an electronic circuit according to an embodiment of the present invention.

FIG. 8 is a sectional side view showing an example of the electronic circuit according to the present embodiment.

Bending degrees of a first bending portion 23 and a second bending portion 24 in a lead pin 21 of an LDA 20 in an electronic circuit 1C shown in FIG. 8 are different from those in the electronic circuit 1 according to the embodiments described above.

A part of the lead pin 21 between the first bending portion 23 and the second bending portion 24 is not provided along a substrate 10 but is curved to take a U shape. The lead pin 21 comes in contact with a land (not shown) to be a terminal of a circuit pattern provided on a back face of the substrate 10 in a place in the vicinity of the first bending portion 23 between the first bending portion 23 and the second bending portion 24.

The first bending portion 23 and the second bending portion 24 are formed as described above. In the electronic circuit 1C, consequently, a solder fillet is formed by a solder 31 in a manner as to surround the lead pin 21 on the back face of the substrate 10.

By the formation of the first bending portion 23 and the second bending portion 24 as described above, moreover, a distance C between the lead pins 21 of adjacent LDAs 20 can be larger in the electronic circuit 1C than that in the electronic circuits according to the related art shown in FIGS. 1 and 2.

According to the electronic circuit 1C, therefore, it is possible to mount the LDA 20 having the lead pins 21 on the substrate 10 by a simple process with high soldering reliability obtained.

Light Source Device

Next, description will be given to an embodiment of a light source device according to the present invention. In the following description, an optical scanner including a light source device will be explained as an example.

Figure 9:
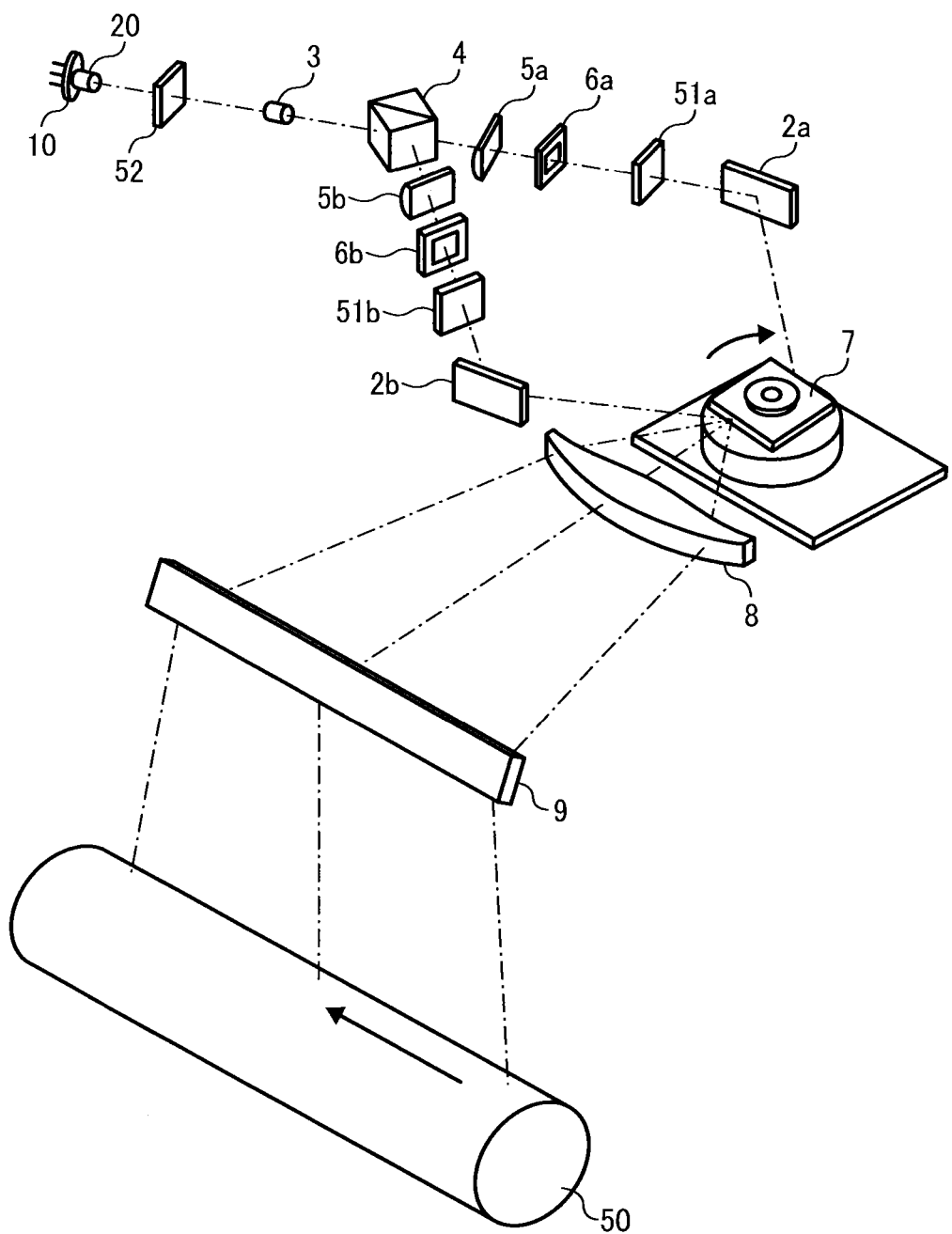
FIG. 9 is a schematic perspective view showing an optical scanner including a light source device according to an example embodiment of the present invention.

FIG. 9 is a schematic perspective view showing an embodiment of the optical scanner including the light source device according to an embodiment of the present invention. In FIG. 9, reference numeral 20 denotes an LDA having a plurality of light emitting points. The LDA 20 is soldered to a substrate 10 so that the light source device according to the embodiment of the present invention is configured.

In FIG. 9, moreover, reference numeral 2 (2a, 2b) denotes an incidence mirror, 3 denotes a coupling lens, 4 denotes a luminous flux splitter (a deflection beam splitter), and 5 (5a, 5b) denotes a cylindrical lens.

In FIG. 9, furthermore, reference numeral 6 (6a, 6b) denotes an aperture diaphragm (an aperture), 7 denotes a deflector serving as a deflection device (a polygon mirror having four deflective reflection surfaces), 8 denotes a scanning lens, and 9 denotes an optical path reflecting mirror.

In FIG. 9, moreover, reference numeral 50 denotes a photoreceptor serving as a surface to be scanned, 51 (51a, 51b) denotes a first optical device (a λ/4 plate) taking a shape of parallel plates which can change a polarization state, and 52 denotes a second optical device (a λ/4 plate) taking a shape of parallel plates which can change a polarization state.

The polygon mirror 7 is rotated at a constant angular velocity in a direction of an arrow in FIG. 9 about a rotation shaft set as an axis by a driving mechanism (not shown). A direction in which a luminous flux emitted from the LDA 20 is deflected and scanned by the polygon mirror 7 is set to be a main scanning direction, and a direction which is orthogonal to the main scanning direction is set to be a sub-scanning direction.

A divergent luminous flux emitted from the LDA 20 passes through the λ/4 plate 52 and is thus converted into an almost parallel luminous flux by the coupling lens 3. The luminous flux emitted from the coupling lens 3 is incident on the luminous flux splitter 4.

The luminous flux emitted from the LDA 20 and incident on the luminous flux splitter 4 is divided into two parts, and the luminous flux emitted from the luminous flux splitter 4 is changed into two luminous fluxes. The two luminous fluxes emitted from the luminous flux splitter 4 are converted into long line images each in the main scanning direction in the vicinity of the deflective reflection surface of the polygon mirror 7 by the cylindrical lens 5.

The luminous flux passing through the cylindrical lens 5 and converged in the sub-scanning direction passes through the aperture 6 for stabilizing a beam diameter on a surface of the photoreceptor 50, and furthermore, passes through the λ/4 plate 51 and is thus changed into a long line image in the main scanning direction in the vicinity of the deflective reflection surface of the polygon mirror 7.

Figure 10:
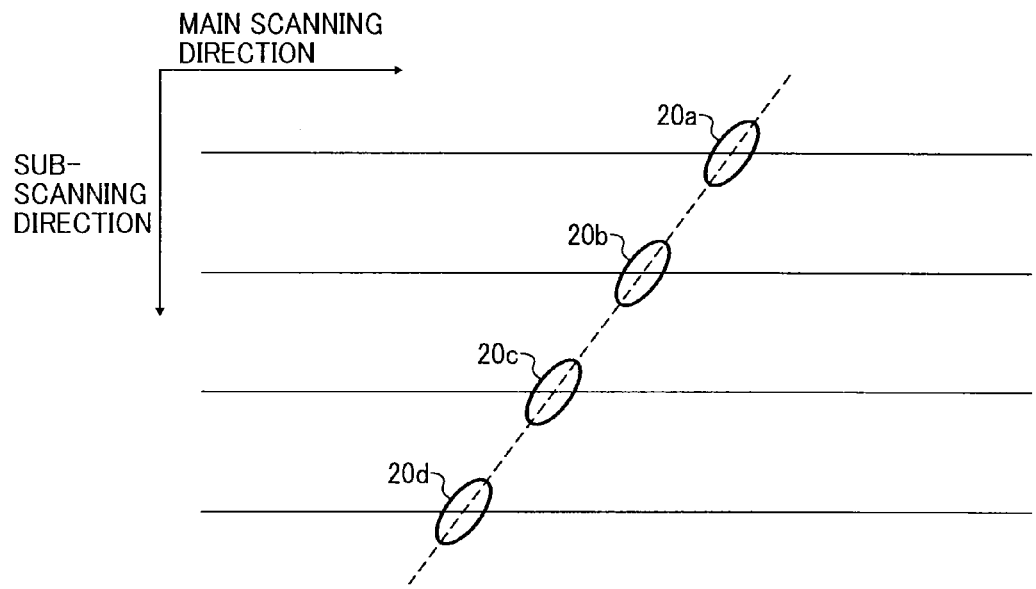
FIG. 10 is a schematic view showing an example of pitch adjustment in a sub-scanning direction of the light source device of FIG. 9.

FIG. 10 is a schematic view showing an example of pitch adjustment in the sub-scanning direction of the light source device. As shown in FIG. 10, in the light source device according to the present embodiment, LDAs 20a to 20d are disposed at a regular interval in the sub-scanning direction in the same substrate. The LDAs 20a to 20d are arranged by shifting positions in the main scanning direction (obliquely as seen in a perpendicular direction to the substrate (a transverse direction in FIG. 10)).

Figure 11:
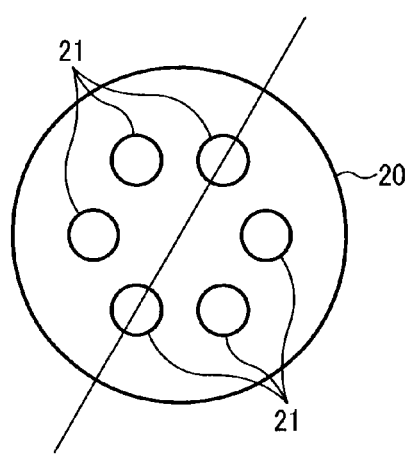
FIG. 11 is a schematic view showing an LDA after the pitch adjustment of FIG. 10.

FIG. 11 is a schematic view showing the LDA 20 having subjected to the pitch adjustment. As shown in FIG. 11, the LDA 20 having subjected to the pitch adjustment in the sub-scanning direction is tilted in the main scanning direction at a predetermined angle and is fixed to the substrate.

As described above, in the light source device according to the present embodiment, it is possible to ensure a sufficient distance between the lead pins even in the case in which attachment intervals between the LDAs 20 are close to each other by optical limitations when the LDAs 20 are to be mounted in the same substrate.

In other words, in the light source device according to the present embodiment, it is possible to make a sub-scanning interval uniform before assembling the LDA 20, that is, to perform so-called pitch adjustment between sub-scanning beams even in the case in which the respective attachment intervals between the LDAs 20 are close to each other.

According to the light source device in accordance with the present embodiment, therefore, it is possible to enhance printing speed and definition by mounting the LDAs 20 at a small interval in the same substrate.

Method of Manufacturing Electronic Circuit

Next, description will be given to an embodiment of a method of manufacturing an electronic circuit.

Figure 12:
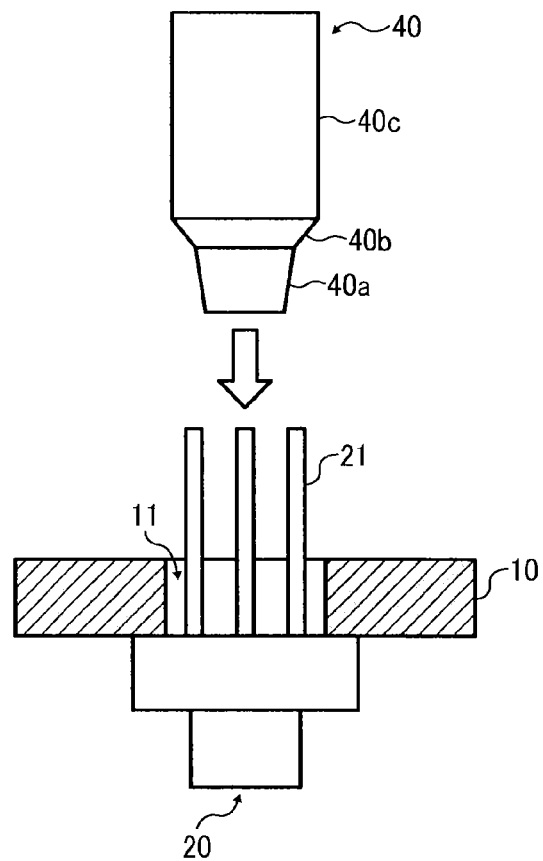
FIG. 12 is a sectional side view showing the LDA, illustrating a state brought before insertion of a jig bit in a method of manufacturing an electronic circuit according to an example embodiment of the present invention.

FIG. 12 is a sectional side view showing an LDA 20, illustrating a state brought before insertion of a jig bit 40 in the method of manufacturing an electronic circuit. As shown in FIG. 12, a hole 11 is provided in a predetermined position of a substrate 10. The hole 11 has a larger dimension than a maximum distance (a lead pin circle diameter) d between lead pins 21. The lead pins 21 of the LDA 20 are inserted from the front face toward the back face in the substrate 10.

After the lead pins 21 are inserted into the hole 11, the jig bit 40 is inserted in a direction from the back face of the substrate 10 to carry out a lead pin forming process.

The jig bit 40 has a tip portion 40a, an intermediate portion 40b and a base end 40c.

The tip portion 40a takes a shape of a rotor having such a trapezoidal section in which a diameter of a tip is smaller than a diameter of a part connected to the intermediate portion 40b. The tip portion 40a takes a shape of a side surface corresponding to a bending degree of a first bending portion 23.

The intermediate portion 40b connects the tip portion 40a to the base end 40c, and takes a shape of a side surface corresponding to a bending degree of a portion between the first bending portion 23 and a second bending portion 24.

The base end 40c takes a cylindrical shape and corresponds to a bending degree of a portion from the second bending portion 24 to a tip of the lead pin 21.

Figure 13:
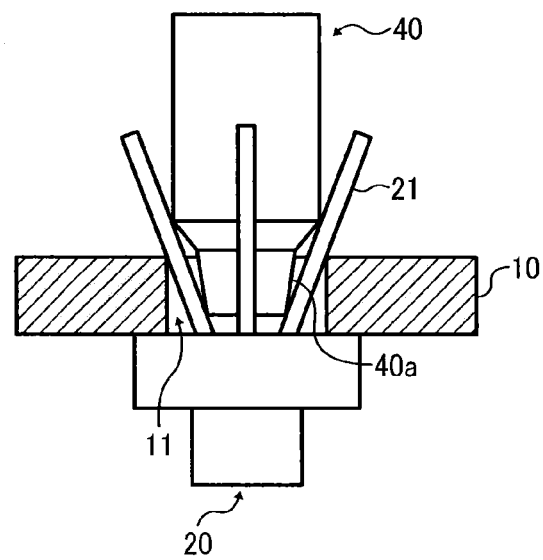
FIG. 13 is a sectional side view showing the LDA, illustrating a state brought after insertion of the jig bit in the method of manufacturing an electronic circuit.

FIG. 13 is a sectional side view showing the LDA 20, illustrating a state brought after the insertion of the jig bit 40 in the method of manufacturing an electronic circuit. As shown in FIG. 13, when the jig bit 40 is inserted into the hole 11, the lead pins 21 are bent in directions so as to separate from each other because the tip portion 40a of the jig bit 40 takes a shape corresponding to the bending degree of each of the first bending portions 23.

Moreover, it is desirable to use a material having a low thermal conductivity such as a ceramic for the jig bit 40. The reason is that heat should be prevented from escaping from the lead pin 21 to the jig bit 40 when the lead pin 21 is held by the jig bit 40 to solder the lead pin 21 as will be described below.

Figure 14:
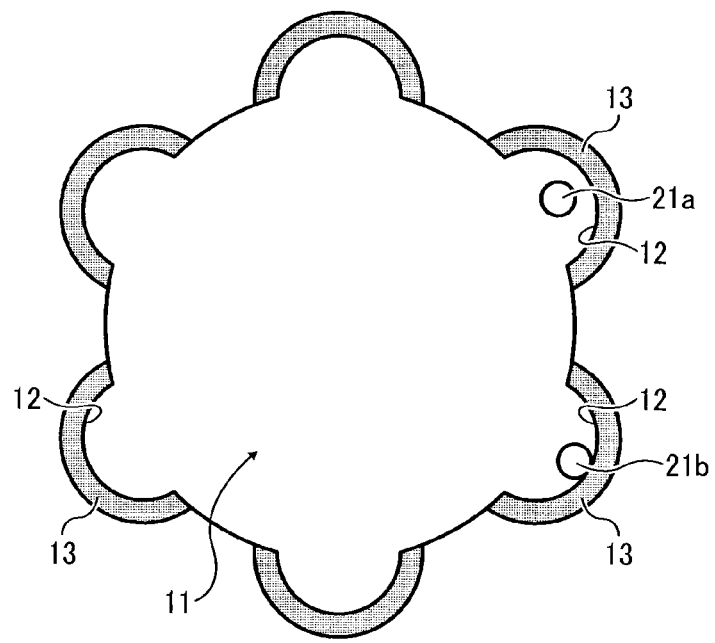
FIG. 14 is a rear view showing a positional relationship between notches and lead pins in the method of manufacturing an electronic circuit.

FIG. 14 is a rear view showing a positional relationship between notches and lead pins in the method of manufacturing an electronic circuit. As shown in FIG. 14, notches 12 for positioning the lead pins 21 are provided on a circumference of the hole 11 in the substrate 10. A land 13 is provided on a circumference of each of the notch 12. The lead pin 21 is electrically connected to the land 13 in contact therewith as shown in FIG. 14.

FIG. 14 shows a state brought before a lead pin indicated by reference numeral 21a is guided by the notch 12 and thus abuts on the land 13. Moreover, there is shown a state brought after a lead pin indicated by reference numeral 21b is guided by the notch 12 and thus abuts on the land 13.

Figure 15:
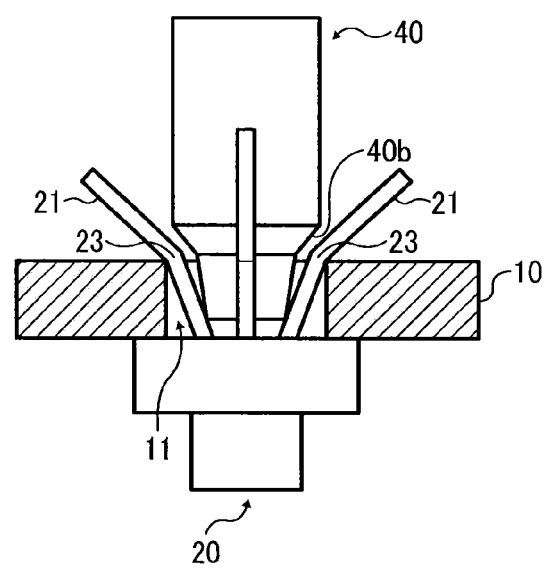
FIG. 15 is a sectional side view showing the LDA, illustrating the lead pins each bent in a first bending section in the method of manufacturing an electronic circuit.

FIG. 15 is a sectional side view showing the LDA 20, illustrating the lead pins 21 each bent by the first bending portion 23 in the method of manufacturing an electronic circuit. As shown in FIG. 15, when the jig bit 40 is further inserted into the hole 11, the lead pins 21 are caused to come in contact with each edge of the hole 11 (an edge of a notch which is not shown) and are thus bent by the intermediate portion 40b. The lead pins 21 are pressed by the intermediate portion 40b and are thus bent so that the first bending portions 23 are formed on the lead pins 21.

The bending directions at the first bending portions 23 are equivalent to directions in which the lead pins 21 separate from each other (directions in which the lead pins approach the substrate 10).

Figure 16:
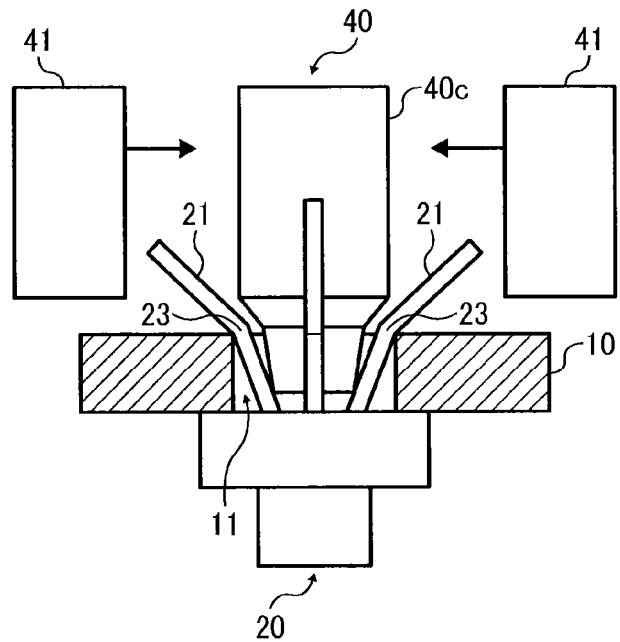
FIG. 16 is a sectional side view showing the LDA, illustrating a state brought before molding the lead pins by a forming jig in the method of manufacturing an electronic circuit.

FIG. 16 is a sectional side view showing the LDA 20, illustrating a state brought before molding the lead pins 21 by a forming jig 41 in the method of manufacturing an electronic circuit. As shown in FIG. 16, the lead pins 21 are interposed between the base end 40c of the jig bit 40 and the forming jig 41 with the jig bit 40 maintained in the insertion state.

The forming jig 41 has a curved surface corresponding to a cylindrical side surface of the base end 40c of the jig bit 40.

Figure 17:
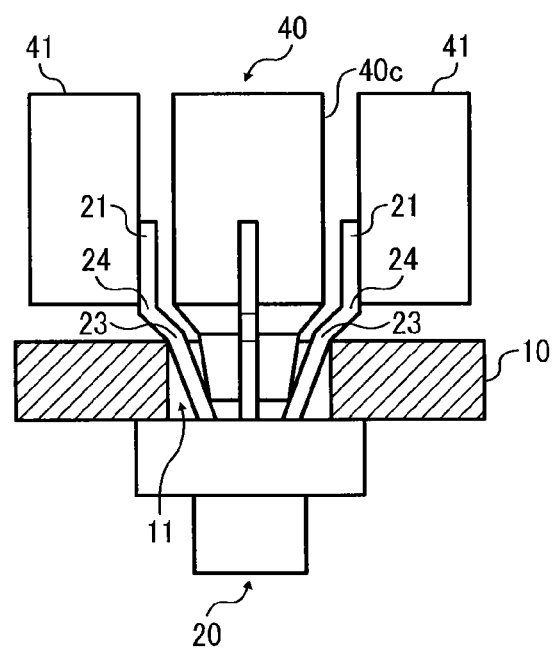
FIG. 17 is a sectional side view showing the LDA, illustrating a state brought when molding the lead pins by the forming jig in the method of manufacturing an electronic circuit.

FIG. 17 is a sectional side view showing the LDA 20, illustrating a state brought when molding the lead pins 21 by the forming jig 41 in the method of manufacturing an electronic circuit. When the lead pin 21s are interposed between the base end 40c of the jig bit 40 and the forming jig 41, the second bending portion 24 is formed in a position close to the tip from the first bending portion 23 in the lead pin 21. The bending directions at the second bending portions 24 are equivalent to directions in which the lead pins 21 approach each other (directions in which the lead pins separate from the substrate 10).

Figure 18:
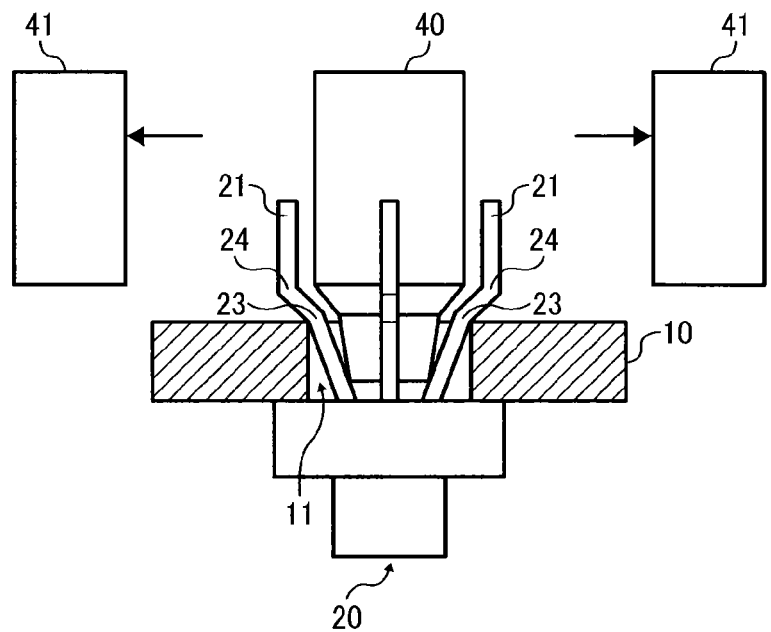
FIG. 18 is a sectional side view showing a state brought after molding the lead pins by the forming jig in the method of manufacturing an electronic circuit.

FIG. 18 is a sectional side view showing the LDA 20, illustrating a state brought after molding the lead pins 21 by the forming jig 41 in the method of manufacturing an electronic circuit. As shown in FIG. 18, after the second bending portions 24 are formed, the forming jig 41 is separated from the jig bit 40.

Figure 19:
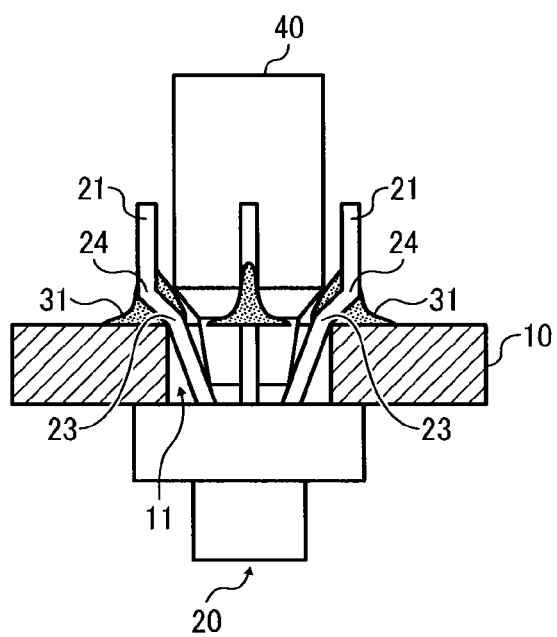
FIG. 19 is a sectional side view showing the LDA, illustrating a soldering state of the lead pins in the method of manufacturing an electronic circuit.

FIG. 19 is a sectional side view showing the LDA 20, illustrating a soldering state of the lead pins 21 in the method of manufacturing an electronic circuit. As shown in FIG. 19, after the forming jig 41 is separated, the lead pins 21 and the substrate 10 are soldered by the solder 31 with the jig bit 40 inserted. In order to fix a position in which the soldering is to be carried out, the soldering is performed with the jig bit 40 inserted.

Figure 20:
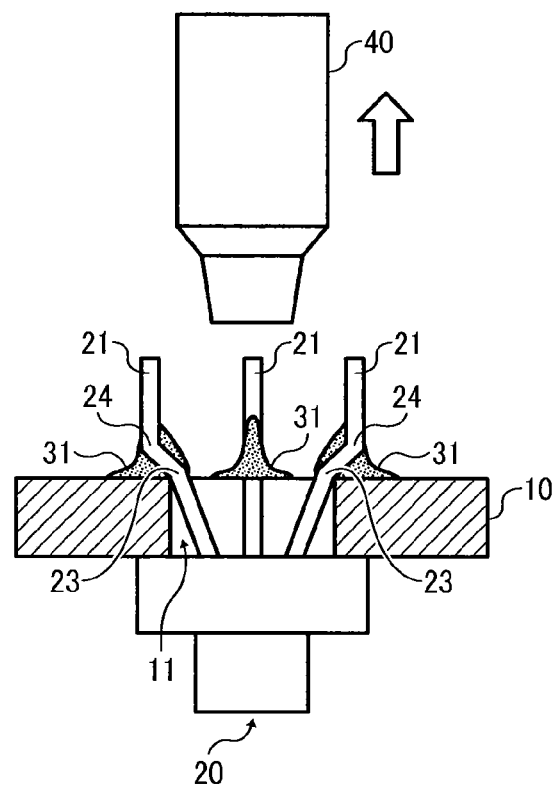
FIG. 20 is a sectional side view showing the LDA, illustrating a state brought after removing the jig bit in the method of manufacturing an electronic circuit.

FIG. 20 is a sectional side view showing the LDA 20, illustrating a state brought after removing the jig bit 40 in the method of manufacturing an electronic circuit. As shown in FIG. 20, after the soldering is carried out, the jig bit 40 is removed from the hole 11.

Figure 21:
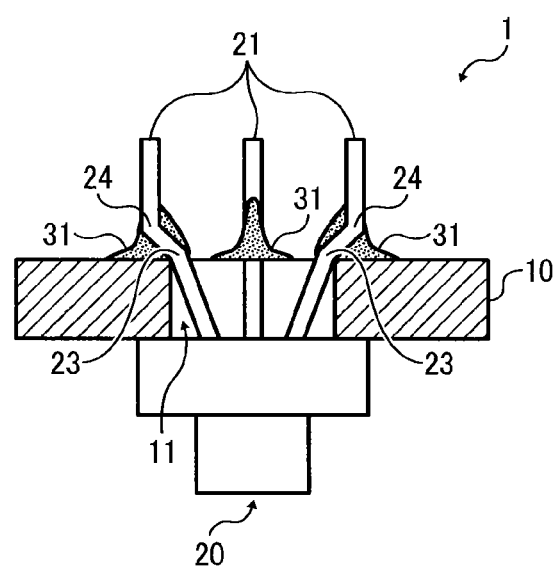
FIG. 21 is a sectional side view showing the LDA, illustrating a state brought in completion of the electronic circuit in the method of manufacturing an electronic circuit.

FIG. 21 is a sectional side view showing the LDA 20, illustrating a state brought in completion of the electronic circuit 1 in the method of manufacturing an electronic circuit. As shown in FIG. 21, when the jig bit 40 is removed, the electronic circuit is completed.

As described above, in the method of manufacturing an electronic circuit according to an embodiment of the present invention, the bending portions are formed on the lead pins 21 inserted into the holes 11 in a corresponding number to the number of the LDAs 20 provided on the substrate 10, and subsequently, the solder 31 is caused to flow into portions each between the land 13 and the lead pin 21. In the method of manufacturing an electronic circuit, consequently, it is possible to form a solder fillet which can obtain high reliability of soldering strength.

According to the method of manufacturing an electronic circuit in accordance with the present embodiment, therefore, it is possible to reduce man-hours and time period for an assembling work process of the LDA 20 to the substrate 10 without increasing the number of components, and to enhance the reliability of soldering, thereby easily assembling the electronic components at a high density.

According to the method of manufacturing an electronic circuit in accordance with the present embodiment, moreover, the positioning notch 12 for each of the lead pins 21 is provided and the lead pin 21 is caused to abut on the peripheral wall of the notch 12 so that the first bending portion 23 is formed. In the method of manufacturing an electronic circuit according to the present embodiment, therefore, it is possible to reliably cause the lead pin 21 to come in contact with the land 13 provided in the vicinity of the peripheral wall of the notch 12.

According to the method of manufacturing an electronic circuit in accordance with the present embodiment, therefore, it is possible to reduce man-hours and time period for an assembling work process of the LDA 20 to the substrate 10 and to enhance the reliability of soldering, thereby easily assembling the electronic components at a high density.

What is claimed is:

1. An electronic circuit, comprising:
   a substrate having a first side and a second side opposite the first side formed with a hole having a larger dimension than a maximum distance between at least two lead pins of a plurality of lead pins of an electronic component; and
   the electronic component having the plurality of lead pins to be electrically connected to wirings on the substrate,
   wherein each of the lead pins is inserted in the hole from the first side to the second side of the substrate, and has a tip portion and a plurality of bending portions arranged external to the hole at the second side of the substrate, and
   wherein each of the lead pins has a portion between the bending portions fixed at the second side of the substrate by solder.

2. The electronic circuit according to claim 1, wherein bending directions of bending portions of the plurality per lead pin provided at a greatest distance from tips of the lead pins among the plurality of bending portions are equivalent to directions in which the lead pins are separated from each other.

3. The electronic circuit according to claim 1, wherein bending directions of bending portions of the plurality per lead pin provided closest to tips of the lead pins among the plurality of bending portions are equivalent to directions in which the lead pins approach each other.

4. The electronic circuit according to claim 1, wherein the hole is provided with a positioning notch for each of the lead pins.

5. The electronic circuit according to claim 1,
wherein the bending portions of each of the lead pins includes:
a first bending portion; and
a second bending portion provided on a tip side of the lead pin as compared to the first bending portion, and
wherein, for each of the lead pins, the portion is between the first bending portion and the second bending portion of the lead pin and contacts the second side of the substrate.

6. The electronic circuit according to claim 5, wherein the solder forms a fillet between the first bending portion and the second bending portion.

7. The electronic circuit according to claim 1, wherein the electronic component is mounted in plural on the substrate.

8. A light source device, comprising the electronic circuit according to claim 1.

9. The electronic circuit according to claim 1, wherein the tip portion runs parallel to a central axis of the hole.

10. A method of manufacturing an electronic circuit having an electronic component mounted on a substrate having a first side and a second side opposite the first side, the substrate formed with a hole having a larger dimension than a maximum distance between lead pins of the electronic component, the method comprising:
inserting the lead pins into the hole;
forming, in each of the lead pins, a plurality of bending portions external to the hole at the second side of the substrate; and
soldering the lead pins to the substrate at the second side of the substrate,
wherein said soldering includes, for each of the lead pins, fixing a portion between the bending portions at the second side of the substrate using solder.

11. The method of manufacturing an electronic circuit according to claim 10,
wherein a positioning notch for each of the lead pins is provided on the hole, and
wherein said forming the bending portions includes:
causing the lead pins to abut peripheral walls of the notches.

12. The method of manufacturing an electronic circuit according to claim 10, wherein said soldering includes, for each of the lead pins, the portion between the bending portions contacting the second side of the substrate.

13. The electronic circuit according to claim 12, wherein, for each of the lead pins, the parallel running tip portions are offset from the central axis of the hole in an axial direction.

* * * * *